(12) United States Patent
Strang

(10) Patent No.: US 6,954,077 B2
(45) Date of Patent: Oct. 11, 2005

(54) APPARATUS AND METHOD FOR IMPROVING MICROWAVE COUPLING TO A RESONANT CAVITY

(75) Inventor: Eric J. Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 4 days.

(21) Appl. No.: 10/495,774

(22) PCT Filed: Jan. 31, 2003

(86) PCT No.: PCT/US03/01073

§ 371 (c)(1),
(2), (4) Date: May 17, 2004

(87) PCT Pub. No.: WO03/065061

PCT Pub. Date: Aug. 7, 2003

(65) Prior Publication Data

US 2005/0046427 A1 Mar. 3, 2005

Related U.S. Application Data

(60) Provisional application No. 60/352,503, filed on Jan. 31, 2002.

(51) Int. Cl.[7] .............................. G01R 27/04; H01P 7/06
(52) U.S. Cl. ....................................... 324/636; 324/637
(58) Field of Search ................................ 324/636, 637, 324/639; 333/227, 230

(56) References Cited

U.S. PATENT DOCUMENTS

| 3,458,808 | A | | 7/1969 | Agdur .......................... 324/633 |
| 5,012,212 | A | | 4/1991 | Matsui et al. ................ 333/227 |
| 5,124,653 | A | * | 6/1992 | Andresen et al. ............ 324/636 |
| 5,648,038 | A | | 7/1997 | Fathi et al. ................... 264/406 |
| 5,691,642 | A | | 11/1997 | Dobkin ........................ 324/464 |
| 6,002,311 | A | | 12/1999 | Wey et al. ................ 333/219.1 |
| 6,549,102 | B2 | * | 4/2003 | Mansour et al. .......... 333/219.1 |
| 6,756,865 | B2 | * | 6/2004 | Saito et al. .................. 333/134 |

* cited by examiner

*Primary Examiner*—Anjan Deb
(74) *Attorney, Agent, or Firm*—Oblon, Spivak, McClelland, Maier & Neustadt, P.C.

(57) ABSTRACT

An equipment status monitoring system (10) and method of operating includes first (40) and second (50) microwave mirrors in a plasma processing chamber (20) each forming a multi-modal resonator. A power source (60) is coupled to the first mirror (40) and configured to produce an excitation signal. A detector (70) is coupled to at least one of the first mirror (40) and the second mirror (50) and configured to measure an excitation signal. At least one of the power source (60) and the detector (70) is coupled to a divergent aperture (44).

38 Claims, 6 Drawing Sheets

US 6,954,077 B2

APPARATUS AND METHOD FOR IMPROVING MICROWAVE COUPLING TO A RESONANT CAVITY

CROSS-REFERENCE TO RELATED APPLICATIONS

This application claims priority to U.S. application Ser. No. 60/352,503, filed on Jan. 31, 2002, the entire contents of which are herein incorporated by reference. This application is related to co-pending International Application No. PCT/US00/19539, Publication No. WO 01/06402, published on Jan. 25, 2001; International Application No. PCT/US00/19536, Publication No. WO 01/06544, published on Jan. 25, 2001; International Application No. PCT/US00/19535, Publication No. WO 01/06268, published on Jan. 25, 2001; International Application No. PCT/US00/19540, Publication No. WO 01/37306, published on May 25, 2001; U.S. Application Ser. No. 60/330,518, entitled "Method and apparatus for wall film monitoring", filed on Oct. 24, 2001; U.S. application Ser. No. 60/330,555, entitled "Method and apparatus for electron density measurement", filed on Oct. 24, 2001; co-pending U.S. Application No. 60/352,502, entitled "Method and apparatus for electron density measurement and verifying process status," filed on Jan. 31, 2002; co-pending U.S. Application No. 60/352,546, entitled "Method and apparatus for determination and control of plasma state," filed on Jan. 31, 2002; and co-pending application 60/352,504, entitled "Method and apparatus for monitoring and verifying equipment status," filed on Jan. 31, 2002. The contents of these applications are incorporated herein by reference.

BACKGROUND OF THE INVENTION

1. Field of the Invention

The present invention generally relates to fabrication of integrated circuits in the semiconductor industry.

2. Discussion of the Background

The fabrication of integrated circuits (IC) in the semiconductor industry typically employs plasma to create and assist surface chemistry within a material processing chamber necessary to remove material from and deposit material to a substrate. In general, plasma is formed within the processing chamber under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate) are chosen to produce a population of charged species and chemically reactive species suitable to the particular process being performed within the chamber (e.g., etching processes where materials are removed from the substrate or deposition processes where materials are added to the substrate).

The semiconductor industry is constantly striving to produce smaller ICs and to increase the yield of viable ICs. Accordingly, the material processing equipment used to process the ICs have been required to meet increasingly more stringent performance requirements for etching and deposition processes (e.g., rate, selectivity, critical dimension).

SUMMARY OF THE INVENTION

The present invention relates to an apparatus and method for improving the microwave coupling into and out of a resonant cavity. An open resonant cavity comprising one or more mirrors is immersed within plasma and utilized for monitoring electron density of plasma. A microwave horn is fabricated within the one or more mirrors in order to improve the efficiency of coupling power into and out of the cavity. The improvement leads to an increased signal-to-noise ratio for the cavity transmission signal which is utilized to measure electron density.

In one embodiment, the microwave horn is simply an H-plane horn (no divergence in aperture in the E-plane).

In an alternate embodiment, the microwave horn is simply an E-plane horn (no divergence in aperture in the H-plane).

In an alternate embodiment, the microwave horn is simply a conical horn (with a rectangular to circular waveguide transition, if necessary).

In an alternate embodiment the microwave horn is a combined E-plane and H-plane horn (e.g., a pyramidal horn).

In an alternate embodiment, the microwave horn includes a diverging aperture comprising a straight wall, a stepped wall, or a corrugated wall.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE PREFERRED EMBODIMENTS

Figure 1A:
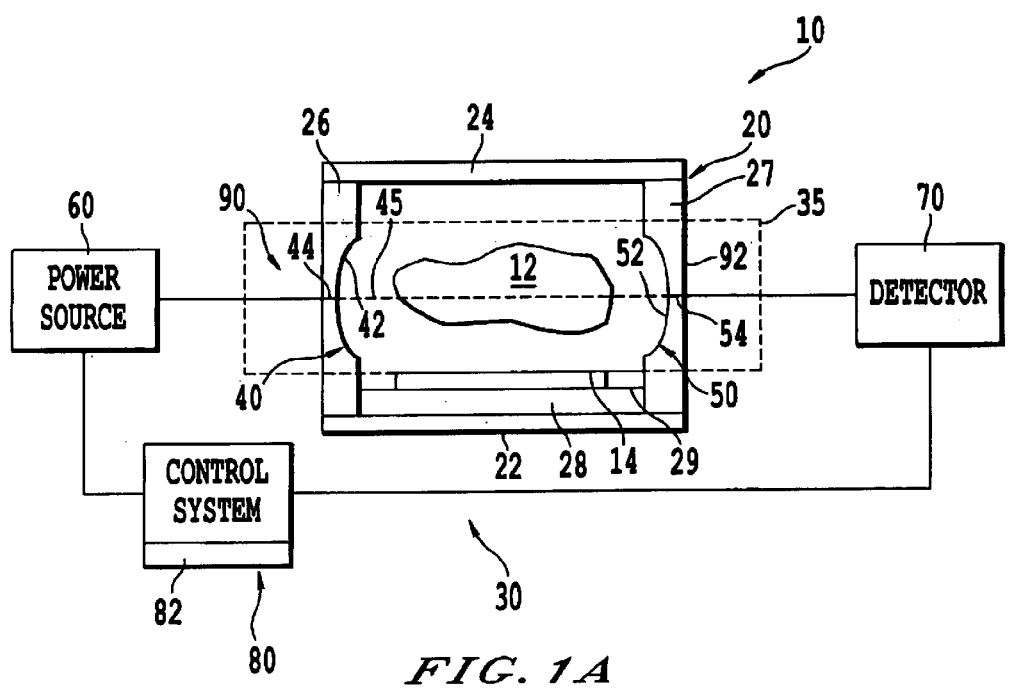
FIG. 1A is a schematic view of an equipment status monitoring system for a material processing chamber according to an embodiment of the present invention.

The present invention generally relates to fabrication of integrated circuits in the semiconductor industry. The present invention advantageously provides a method and apparatus that enables semiconductor manufacturers to satisfy more stringent performance requirements for material processing equipment used in the semiconductor industry.

A method of improving the performance of material processing equipment is to monitor and control plasma electron density within the processing chamber during the manufacturing process. Ideally, the plasma electron density is maintained such that the processes being performed are both steadily acting in time and uniformly acting in space upon the entire surface of the substrate upon which work is being performed.

An exemplary device used to measure plasma electron density is a microwave system of suitably high frequency to exceed the electron plasma frequency. The device includes a pair of mirrors immersed in the plasma. Microwave power is coupled to a first microwave port on the first mirror and a detector is utilized to monitor the transmission of microwave power through the resonant cavity formed by the opposing mirrors. The detector is either coupled to a second port on the first mirror or a second port on the second mirror. For a Gaussian beam, cavity transmission occurs at discrete frequencies. The discrete frequencies correspond to an integer number of half wavelengths between the apex of each mirror, as expressed by the following equation:

$$v_{m,n,q} = v_{0,0,q} = \frac{c}{2\eta d}\left(q + \frac{1}{2}\right), \quad (1)$$

where $v_{0,0,q}$ is a resonant frequency of mode order q (assuming only longitudinal modes, i.e. m=n=0), c is the speed of light in a vacuum, $\eta$ is the index of refraction for the medium bounded by the mirrors and d is the mirror spacing (apex-to-apex). For a vacuum, $\eta=1$, however, the presence of plasma or, more specifically, a population of free electrons leads to a reduction of the index of refraction or an observable increase (shift) of the cavity resonance frequencies $\theta_{0,0,q}$. For a given mode q, the shift in frequency can be related to the index of refraction n and, thereafter, the (integrated) electron density $<n_e>$, is expressed by the following equation:

$$\langle n_e \rangle \cong \frac{8\pi^2 \varepsilon_o}{e^2} v_o \Delta v, \quad (2)$$

for $\theta_0 >> \omega_{pe}/2\pi$. For further details, the use of the above system to measure plasma electron density is described in International App. No. PCT/US00/19539 (based upon U.S. Ser. No. 60/144,880), International App. No. PCT/US00/19536 (based upon U.S. Ser. No. 60/144,883), International App. No. PCT/US00/19535 (based upon U.S. Ser. No. 60/144,878), and International App. No. PCT/US00/19540 (based upon U.S. Ser. No. 60/166,418), each of which is incorporated herein by reference in its entirety.

In addition to monitoring plasma electron density, it is also advantageous to monitor the equipment status of the material processing chamber. In particular, it is advantageous to monitor the status of the substrate to assure the presence of the substrate prior to processing, to assure the type of substrate prior to processing and to assure the location of the substrate prior to processing. Any deviation from the known substrate status can lead to loss of device yield and/or processing system shut-down. Moreover, it is advantageous to monitor the status of the chamber assembly to assure proper assembly of the chamber and to assure the proper chamber for the above process. Additionally, it is advantageous to monitor the status of chamber consumables to assure proper performance of the material processing system. Failure to detect an improper status of any of the above conditions can lead to catastrophic consequences for devices on the processed substrate. In order to combat this problem, an improper status of the material processing equipment can be detected, identified and corrected.

An embodiment of the plasma processing system 10 according to the present invention is depicted in FIG. 1A. The plasma processing system 10 includes a plasma chamber 20 and an equipment monitoring system 30 for use in the plasma chamber 20. The equipment monitoring system 30 generally includes at least one multi-modal resonator 35, power source 60, detector 70, and control system 80. Desirably, multi-modal resonator 35 comprises an open resonant cavity having at least one reflecting surface, and reflecting surfaces can have planar and/or non-planar geometries. In a preferred embodiment, the reflecting surfaces are provided within plasma chamber 20. Alternatively, at least one reflecting surface can be provided outside plasma chamber 20.

The plasma chamber 20 generally includes a base wall 22, an upper wall 24, and side walls including a first side wall 26 and a second side wall 27. The plasma chamber 20 also includes a substrate holder (or chuck assembly) 28 having a wafer plane 29, such as an upper surface of the substrate holder 28 upon which a substrate 14 is positioned in order to be processed within the plasma chamber 20.

In a preferred embodiment, multi-modal resonator 35 comprises first microwave mirror 40 coupled to power source 60, and second microwave mirror 50 coupled to detector 70. Multi-modal resonator extends along an axis generally parallel to a wafer plane of substrate holder 28 within plasma chamber 20. In an alternate embodiment, the power source 60 and the detector 70 are coupled to the same mirror (40 or 50).

In a preferred embodiment, the first microwave mirror 40 has a concave surface 42 and is provided within the plasma chamber 20. The second microwave mirror 50 has a concave surface 52 and is also provided within the plasma chamber 20. Alternately, the mirror surfaces can have flat and/or convex surfaces.

In the embodiment depicted in FIG. 1A, the first mirror 40 is integrated within side wall 26 of the plasma chamber 20 and the second mirror 50 is integrated within side wall 27 of the plasma chamber 20. The concave surface 52 of the second microwave mirror 50 is oriented opposite the concave surface 42 of the first microwave mirror 40. This geometry can be referred to as a confocal geometry when the spacing between the mirrors equals the radius of curvature of the mirrors. In an alternate embodiment, the mirrors are arranged in a semi-confocal configuration wherein a first mirror (comprising a concave surface of radius of curvature R) is located a distance d=R from a second mirror comprising a flat surface. In an alternate embodiment, the spacing d is adjusted to be different than the radius of curvature of both mirrors in the confocal arrangement or the radius of curvature of the first mirror in the semiconfocal arrangement. In an alternate embodiment, the radius of curvature for each mirror is arbitrary. The selection of the spacing and respective mirror radii of curvature is well known to those skilled in the art of designing resonant cavities.

The power source 60 is coupled to the first microwave mirror 40 and is configured to produce an excitation signal. Desirably, the excitation signals within multi-modal resonator 35 extend along an axis 45 generally parallel to a wafer plane 29 of a substrate holder 28. Control system 80 is coupled to power source 60 and is adapted to change at least one of: an output frequency, an output power, an output phase, and an operating state of power source 60. For example, control system 80 can cause power source 60 to change its operational state at various times before, during, and after a plasma has been established in plasma chamber 20.

Control system 80 is also coupled to detector 70. Desirably, detector 70 is configured to measure at least one transmitted excitation signal and provide transmitted signal measurement data, and detector 70 is configured to measure at least one reflected excitation signal and provide reflected signal measurement data. Alternately, detector 70 is configured to measure at least one transmitted excitation signal and provide transmitted signal measurement data, or detector 70 is configured to measure at least one reflected excitation signal and provide reflected signal measurement data In the embodiment depicted in FIG. 1A, the microwave mirrors 40 and 50 are immersed within the process plasma 12 such that the concave surfaces 42 and 52, respectively, oppose one another. Microwave power is input from the power source 60 to the first mirror 40 via a microwave aperture (referred to as a source-side aperture) and the detector 70 is configured to monitor cavity transmission (at a detector-side aperture) by being coupled to the opposite second mirror 50. The detector 70 can be coupled to either the mirror opposite to the mirror to which microwave power is input, as is the case in FIG. 1A, or the detector can be coupled to the same mirror to which microwave power is input (i.e. the first mirror 40 in FIG. 1A). As will be discussed in further detail below, microwave windows are inserted between the microwave input and the detector, and the respective mirror(s) to which the microwave input and the detector are connected, in order to preserve the integrity of the vacuum within the plasma processing chamber 20.

Figure 1B:
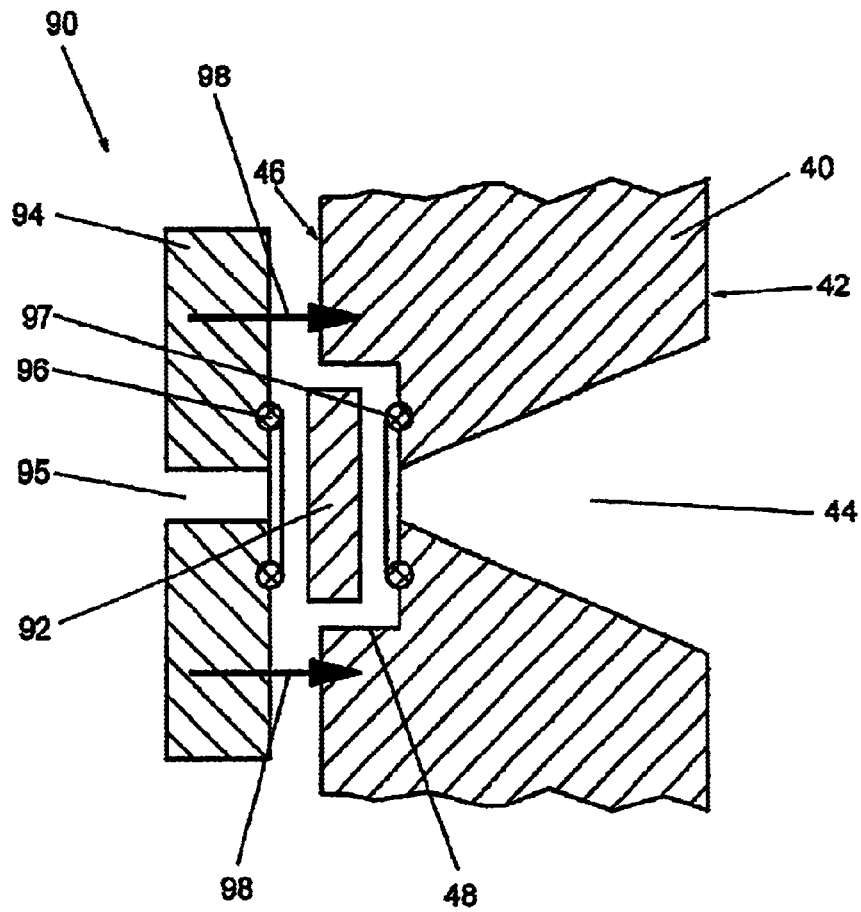
FIG. 1B is an enlarged, exploded, cross-sectional view of a microwave mirror having an aperture, a microwave window and associated mounting structure according to an embodiment of the present invention.
Figure 1C:
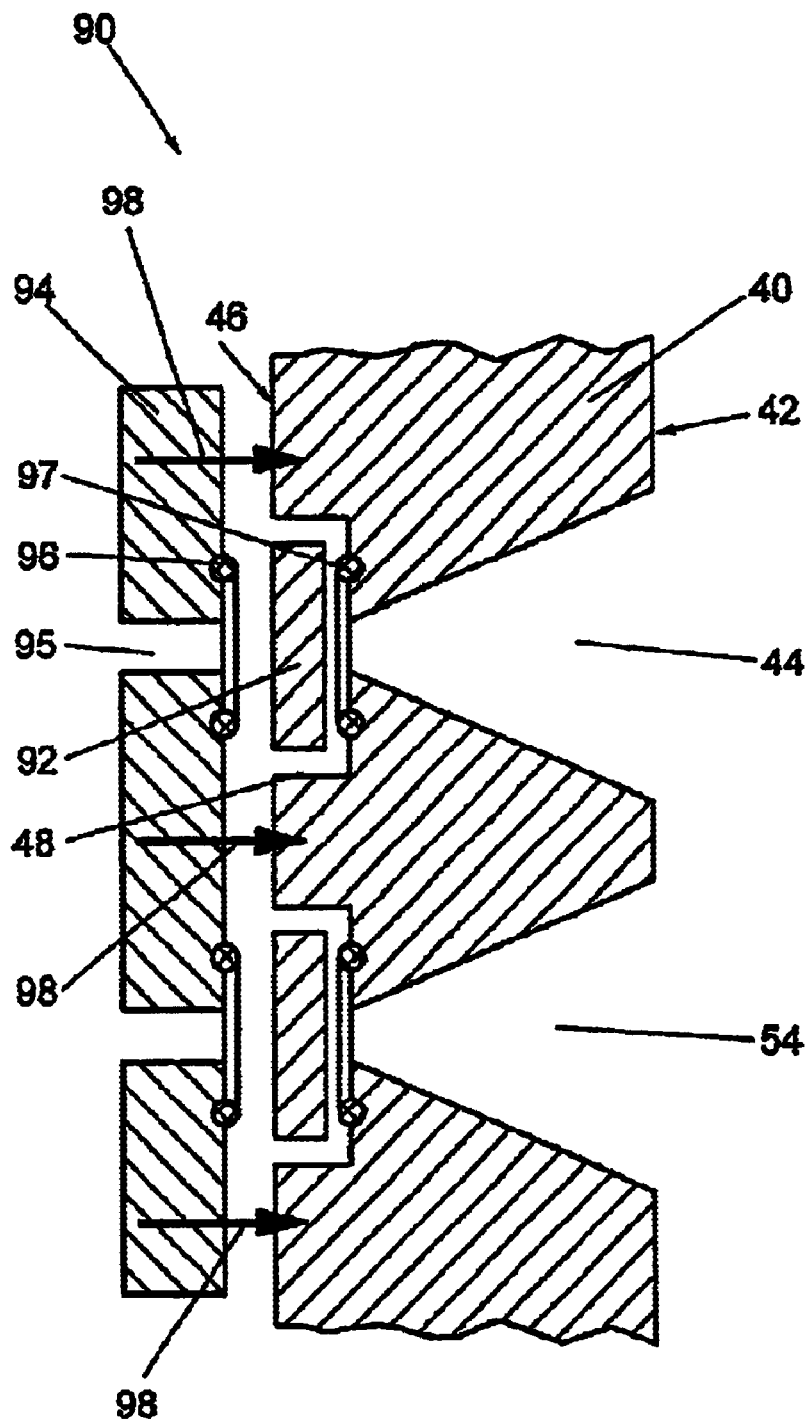
FIG. 1C is an enlarged, exploded, cross-sectional view of a microwave mirror having a first aperture for providing power to a multi-modal resonator, a second aperture for receiving an excitation signal, a microwave window and associated mounting structure according to an embodiment of the present invention.

FIG. 1B depicts a detailed schematic of a microwave window assembly 90 for the first mirror 40, which is used to provide a coupling from the power source 60 through a diverging aperture 44 (i.e., the source-side aperture) in chamber wall 26 to the first mirror 40. It should be understood by those skilled in the art that the aperture need not diverge in multiple planes. Instead, the aperture 44 may diverge in the E-plane without diverging in the H-plane or vice versa. Similarly, the aperture may be conical or pyramidal and still be diverging.) In one embodiment, a window assembly 90 having an identical structure is also provided for the second mirror 50, which is used to provide a coupling to the detector 70 through an aperture 54 (i.e., the detector-side aperture) in chamber wall 27 from the second mirror 50. In an alternate embodiment, shown in FIG. 1C, source- and detector-side apertures 44 and 54 are connected to the same mirror. In other embodiments (not shown), only one of the source-side and detector-side apertures is diverging while the other side is non-diverging. In embodiments in which both the source- and detector-side apertures are diverging, the source- and detector-side apertures may be different. For example, the source-side aperture may be conical and while the detector-side aperture may be pyramidal.

The microwave window assembly 90 depicted in FIG. 1B includes a microwave window 92 that is fastened between a window flange 94 and a rear surface 46 of the first mirror 40. In the embodiment depicted in FIG. 1B, the window 92 is provided within a recessed portion 48 on the rear surface 46 of the first mirror 40. The microwave window 92 is provided between a first O-ring 96 provided on the window flange 94 and a second O-ring 97 provided on the rear surface 46 of the first mirror 40. A plurality of fasteners 98 are provided to mechanically connect the window flange 94 to the first mirror 40 such that the microwave window 92 is securely mounted to the rear surface 46 of the first mirror 40. The window 92 is centered on a waveguide aperture 95 extending through the window flange 94 and the diverging waveguide aperture 44 extending through the first mirror 40. The diverging waveguide aperture 44 and the rectangular waveguide aperture 95 are sized for a specific microwave band of operation and are fabricated using Electrical Discharge Machining (EDM). In general, processing material will form on the vacuum or process side of the window 92, however, the processing material will form at a rate different than it will form on the mirror surface exposed to the plasma. The microwave window 92 is fabricated from a dielectric material such as alumina (sapphire), aluminum nitride, quartz, polytetrafluoroethylene (PTFE/Teflon), or Kapton. The window 92 is preferably fabricated from sapphire due to its compatibility with the oxide etch processes.

From theoretical and experimental considerations, it has been determined that the fabrication of a diverging microwave horn in at least one of the transmitting and receiving mirrors leads to an improvement in the coupling of microwave power into and out of the resonant cavity. On the transmitting mirror, the microwave horn leads to a reduction of diffraction loss and a more directive microwave beam. From theoretical considerations, the irradiation of the opposing mirror by the transmitting mirror is increased with increasing the aperture ratio. On the receiving mirror, the implementation of a microwave horn appears to simply increase the size of the receiving antenna and, therefore, improve coupling of the cavity transmission to the detector.

The mirrors 40 and 50 are preferably fabricated from aluminum. In alternative embodiments, the mirrors 40 and 50 are anodized with preferably a 10 to 50 micron thick anodization or coated with a material such as Yttria ($Y_2O_3$).

The microwave power source 60 is preferably an electronically tunable voltage controlled Gunn diode oscillator (VCO). When the varactor diode of the VCO is biased with a direct current voltage, the output frequency of the VCO can be varied over some spectral range. Therefore, the VCO specifications generally include center frequency, bandwidth and minimum output power. For example, at 35 GHz, a commercially available VCO is a WBV-28-20160RI Gunn diode oscillator offered by Millitech, LLC (20 Industrial Drive East, South Deerfield, Mass. 01373-0109). The specifications for this VCO include a center frequency of 35 GHz with plus or minus 1 GHz bandwidth and a minimum output power of 40 mW. The bias tuning range can generally extend from +25 V to −25 V, thereby adjusting this bias voltage leads to a change in the output frequency of the VCO. In alternative embodiments, operation at higher frequencies, such as 70 GHz and 105 GHZ, can be achieved using a frequency doubler (MUD-15-16F00) or tripler (MUT-10-16F00) with the above mentioned VCO. Using the above configuration, a center frequency of 70 GHz with plus or minus 2 GHz bandwidth and a minimum output power of 0.4 to 0.9 mW and a center frequency of 105 GHz with plus or minus 3 GHz bandwidth and a minimum output power of 0.4 to 0.7 mW can be achieved, respectively. In a preferred embodiment, a 94 GHz VCO (Model GV-10) is used and is commercially available from Farran Technology LTD (Ballincollig, Cork, Ireland). The Model GV-10 VCO has a center frequency of 94 GHz with plus or minus 750 MHz bandwidth, a minimum output power of 10 mW, and a varactor tuning range of −0 to −25 V.

The detector 70 is preferably a general purpose diode detector such as those commercially available from Millitech, LLC. For example, a DXP-15-RNFW0 and a DXP-10-RNFW0 are general purpose detectors in the V-band (50 to 75 GHz) and W-band (75 to 110 GHz), respectively. The detector detects an excitation signal representing (either linearly or non-linearly) the microwave power transmitted through the multi-model resonator.

The embodiment of the present invention depicted in FIG. 1A has a control system 80 that includes a lock-on circuit 82 connected to the power source 60 and the detector 70. Desirably, control system 80 comprises a computer connected to the lock-on circuit 82. The lock-on circuit 82 can be utilized to lock the frequency of the excitation signal output from the microwave power source 60 to a preselected cavity resonance. The lock-on circuit 82 superimposes a dither signal (e.g. 1 kHz, 10 mV amplitude square wave) on a direct current voltage substantially near the voltage and related output VCO frequency that corresponds with a pre-selected longitudinal frequency in the resonant cavity between the mirrors 40 and 50 of FIG. 1A (i.e. the output frequency of the VCO falls within the "envelope" of the selected cavity resonance). The signal detected by the detector 70 is provided to the lock-on circuit 82, where it represents a first derivative of the cavity transmission function (transmitted power versus frequency). The signal input to the lock-on circuit 82 from the detector 70 provides an error signal by which the direct current component of the VCO bias voltage is adjusted to drive the VCO output frequency to the frequency associated with the peak of a pre-selected longitudinal resonance as shown in FIG. 2.

In addition to operating in a cavity resonance lock-on mode as described above, the control system 80 further provides a function for sweeping the frequency spectrum of the multi-modal resonator. FIG. 2 presents an exemplary cavity transmission function (from a negative polarity detector) indicating several longitudinal resonances and the respective free spectral range (FSR). The cavity transmission as shown in FIG. 2 can be obtained by sweeping the VCO across a suitable frequency range sufficiently greater than the FSR The excitation signal produced by the power source by sweeping the input varactor bias voltage can be, for instance, the cavity transmission or frequency spectrum of resonances.

Figure 2:
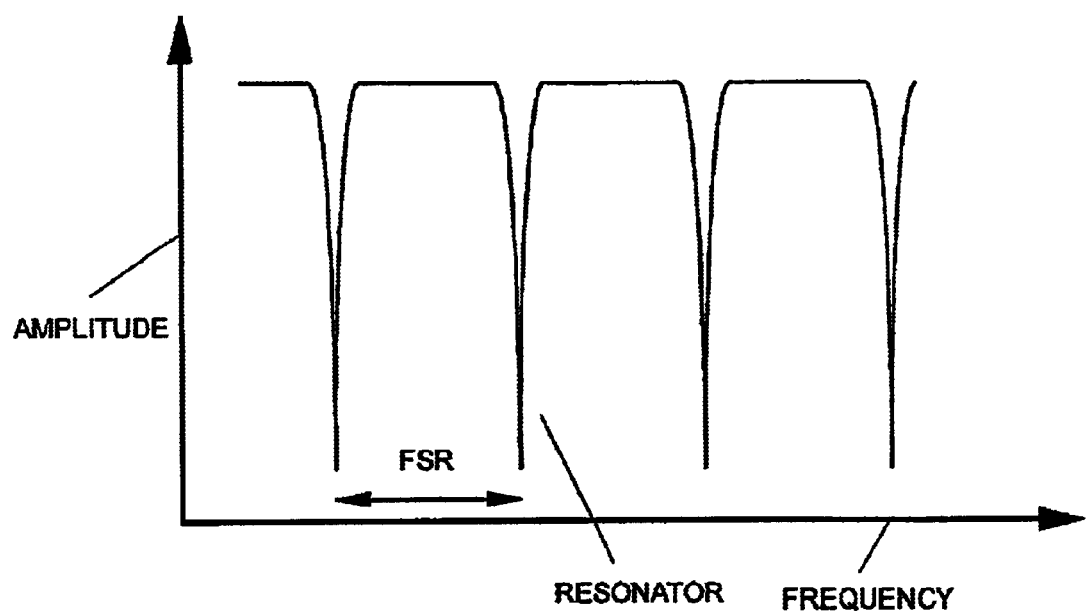
FIG. 2 is a graphical representation of an exemplary cavity transmission function showing several longitudinal resonances and a respective free spectral range.

As described above, the introduction of plasma within the chamber 20 causes a shift in frequency for each of the resonances shown in FIG. 2 (i.e. each of the resonances shift to the right in FIG. 2 when the electron density is increased or the index of refraction is decreased according to equation (1)). Therefore, once the output frequency of the VCO is locked to a selected cavity resonance, the direct current bias voltage with and without plasma can be recorded and the frequency shift of the selected resonance is determined from the voltage difference and the respective VCO calibration. For example, in wafer processing, the direct current bias voltage is recorded once a new wafer is received by the process tool for materials processing and prior to the ignition of plasma. Hereinafter, this measurement will be referred to as the vacuum resonance voltage. Once the plasma is formed, the direct current bias voltage is obtained as a function of time for the given wafer and the time varying voltage difference or ultimately electron density (via equation (2)) is recorded.

Returning again to FIG. 2, the frequency spectrum of the cavity transmission is strongly dependent on several properties of the surrounding structures that are in substantial contact with the multi-modal resonator. These properties can include, but are not limited to, diagnostic properties such as, for example, the mirror alignment, size and design; chamber assembly properties such as, for example, the proximity of the chamber structure surrounding the multi-modal resonator and the materials comprising these structures; properties of the substrate such as, for example, the substrate material, thickness and size, and the substrate proximity to the multimodal resonator; and properties of consumable elements such as size, material and proximity to the multi-modal resonator.

Due to the finite size of the multi-modal resonator, i.e. the diameter of the mirrors 40 and 50, and the diameter of the related microwave beam that extends between the mirrors, electromagnetic energy "spills" from the periphery of the mirrors and interacts with the surrounding structure. Some of this energy is dissipated in the structure and, hence, it is lost to heat; however, some of this energy is scattered from the surrounding structure and re-enters the multi-modal resonator. The scattering of electromagnetic energy by the surrounding structure is very sensitive to the structure geometry, the material type and the proximity of the surrounding structure to the multi-modal resonator. Therefore, it is expected that any change to an above identified property of the surrounding structure can lead to an observable change in the frequency spectrum of cavity resonances; hereinafter referred to as the resonance spectrum (FIG. 2). As described above, a resonance spectrum is one example of an excitation signal produced by sweeping the power source 60.

Figure 3A:
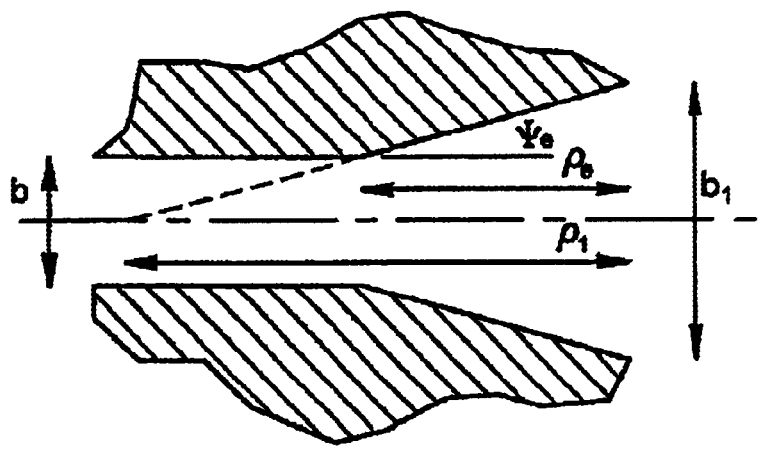
FIG. 3A is an enlarged, cross-sectional view of a horn for use in the structure of FIG. 1B where the cross-sectional view is parallel with the electric field.
Figure 3B:
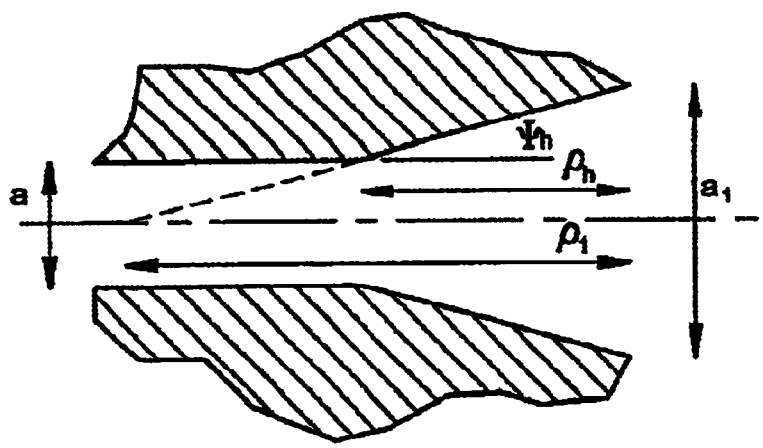
FIG. 3B is an enlarged, cross-sectional view of a horn for use in the structure of FIG. 1B where the cross-sectional view is parallel with the magnetic field.

FIGS. 3A and 3B present schematics of a pyramidal horn in cross-section, wherein the cross-sectional view is parallel with the electric field (i.e. E-plane) in FIG. 3A and the cross-sectional view is parallel with the magnetic field (i.e. H-plane) in FIG. 3B. Such a horn geometry can be described by four parameters, namely, (1) the horn aperture ratio in the H-plane (i.e., $a_1/a$ (where a, $a_1$ are the input (rectangular) and exit aperture widths of the pyramidal horn in the H-plane, respectively)), (2) the horn aperture ratio in the E-plane (i.e. $b_1/b$ (where b, $b_1$ are the input (rectangular) and exit aperture widths of the pyramidal horn in the E-plane, respectively)), (3) the horn angle in the E-plane (or non-dimensional length) $\psi_e = \tan(0.5*(b_1-b)/\rho_e)$, and (4) the horn angle in the H-plane (or non-dimensional length) $\psi_h = \tan(0.5*(a_1-a)/\rho_h)$. For the case of a pyramidal horn with $a_1/a = b_1/b$, the lengths $\rho_e = \rho_h$ are equivalent.

Figure 4A:
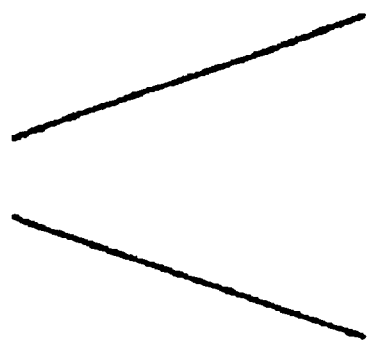
FIG. 4A is a cross-sectional view of a horn comprising a straight wall.
Figure 4B:
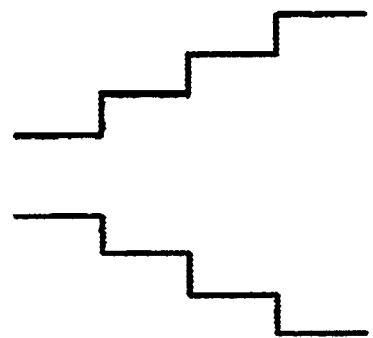
FIG. 4B is a cross-sectional view of a horn comprising a stepped wall.
Figure 4C:
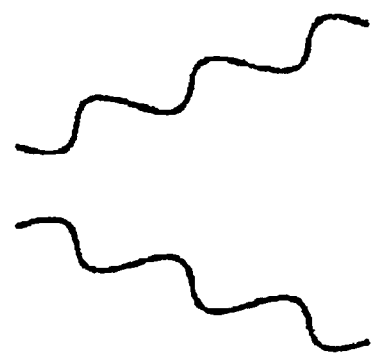
FIG. 4C is a cross-sectional view of a horn comprising a corrugated wall.

Additionally, the diverging aperture as described in FIGS. 3A and 3B can comprise a straight wall (FIG. 4A), a stepped wall (FIG. 4B), or a corrugated wall (FIG. 4C).

Advantageously, the present invention improves coupling of power into and out of resonant cavity by using a microwave horn fabricated within microwave mirror and/or improving power transmission through resonant cavity with a microwave horn at resonance frequency (higher resonance amplitudes).

It should be noted that the exemplary embodiments depicted and described herein set forth the preferred embodiments of the present invention, and are not meant to limit the scope of the claims hereto in any way.

Numerous modifications and variations of the present invention are possible in light of the above teachings. It is therefore to be understood that, within the scope of the appended claims, the invention may be practiced otherwise than as specifically described herein.

What is claimed is:

1. An equipment status monitoring system, said equipment status monitoring system comprising:
   at least one multi-modal resonator;
   a power source coupled to said at least one multi-modal resonator, said power source being configured to produce an excitation signal corresponding to at least one mode of said multi-modal resonator;
   a detector including a diverging aperture coupled to said at least one multi-modal resonator, said detector being configured to measure said excitation signal.

2. The equipment status monitoring system according to claim 1, wherein said power source is coupled to said at least one multi-modal resonator using a second diverging aperture.

3. The equipment status monitoring system according to claim 1, wherein the power source and the detector are both coupled to the diverging aperture.

4. The equipment status monitoring system according to claim 1, wherein said diverging aperture diverges in an electric field plane.

5. The equipment status monitoring system according to claim 1, wherein said diverging aperture diverges in a magnetic field plane.

6. The equipment status monitoring system according to claim 1, wherein said diverging aperture comprises a pyramidal aperture.

7. The equipment status monitoring system according to claim 1, wherein said diverging aperture comprises at least one of a stepped aperture and a corrugated aperture.

8. The equipment status monitoring system according to claim 1, wherein said diverging aperture comprises a conical aperture.

9. The equipment status monitoring system according to claim 1, wherein said excitation signal is a spectrum comprising at least one modal frequency.

10. The equipment status monitoring system according to claim 1, wherein the power source is coupled to a first mirror and the detector is coupled to a second mirror.

11. The equipment status monitoring system according to claim 1, wherein the power source and the detector are coupled to a single mirror.

12. An equipment status monitoring system, said equipment status monitoring system comprising:
    at least one multi-modal resonator;
    a power source coupled to said at least one multi-modal resonator using a diverging aperture, said power source being configured to produce an excitation signal corresponding to at least one mode of said multi-modal resonator;
    a detector coupled to said at least one multi-modal resonator, said detector being configured to measure said excitation signal.

13. The equipment status monitoring system according to claim 12, wherein said detector is coupled to said at least one multi-modal resonator using a diverging aperture.

14. The equipment status monitoring system according to claim 12, wherein said diverging aperture diverges in an electric field plane.

15. The equipment status monitoring system according to claim 12, wherein said diverging aperture diverges in a magnetic field plane.

16. The equipment status monitoring system according to claim 12, wherein said diverging aperture comprises a pyramidal aperture.

17. The equipment status monitoring system according to claim 12, wherein said diverging aperture comprises at least one of a stepped and a corrugated aperture.

18. The equipment status monitoring system according to claim 12, wherein said diverging aperture comprises a conical aperture.

19. The equipment status monitoring system according to claim 12, wherein said excitation signal is a spectrum comprising at least one modal frequency.

20. The equipment status monitoring system according to claim 12, wherein the power source is coupled to a first mirror and the detector is coupled to a second mirror.

21. The equipment status monitoring system according to claim 12 wherein the power source and the detector are coupled to a single mirror.

22. A method of monitoring a status of a material processing system, said material processing system including a chamber, at least one multi-modal resonator positioned in relation to said chamber, a power source coupled to said multi-modal resonator, and a diverging aperture coupled between a detector and said multi-modal resonator, said method comprising the steps of:
    sweeping an output frequency of said power source to produce said excitation signal;
    passing said excitation signal through said diverging aperture; and
    detecting said excitation signal from said multi-mode resonator.

23. The method according to claim 22, wherein said diverging aperture diverges in an electric field plane.

24. The method according to claim 22, wherein said diverging aperture diverges in a magnetic field plane.

25. The method according to claim 22, wherein said diverging aperture comprises a pyramidal aperture.

26. The method according to claim 22, wherein said diverging aperture comprises a conical aperture.

27. The method according to claim 22, wherein said power source is coupled to said at least one multi-modal resonator using a diverging aperture.

28. The method according to claim 22, further comprising coupling the power source to the diverging aperture.

29. The method according to claim 22, wherein the power source is coupled to a first mirror and the detector is coupled to a second mirror.

30. The method according to claim 22, wherein the power source and the detector are coupled to a single mirror.

31. A method of monitoring a status of a material processing system, said material processing system including a chamber, at least one multi-modal resonator positioned in relation to said chamber, a power source coupled to said multi-modal resonator using a diverging aperture, and detector coupled to said multi-modal resonator, said method comprising the steps of:
    sweeping an output frequency of said power source to produce said excitation signal;
    passing said excitation signal through said diverging aperture; and
    detecting said excitation signal from said multi-mode resonator.

32. The method according to claim 31, wherein said detector is coupled to said at least one multi-modal resonator using a diverging aperture.

33. The method according to claim 31, wherein said diverging aperture diverges in an electric field plane.

34. The method according to claim 31, wherein said diverging aperture diverges in a magnetic field plane.

35. The method according to claim 31, wherein said diverging aperture comprises a pyramidal aperture.

36. The method according to claim 31, wherein said diverging aperture comprises a conical aperture.

37. The method according to claim 31, wherein the power source is coupled to a first mirror and the detector is coupled to a second mirror.

38. The method according to claim 31, wherein the power source and the detector are coupled to a single mirror.

* * * * *